(12) United States Patent
Kiesewetter et al.

(10) Patent No.: US 7,579,854 B2
(45) Date of Patent: Aug. 25, 2009

(54) PROBE STATION AND METHOD FOR MEASUREMENTS OF SEMICONDUCTOR DEVICES UNDER DEFINED ATMOSPHERE

(75) Inventors: Jörg Kiesewetter, Thiendorf OT Sacka (DE); Stefan Kreissig, Venusberg (DE); Stojan Kanev, Thiendorf OT Sacka (DE); Claus Dietrich, Thiendorf OT Sacka (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 0 days.

(21) Appl. No.: 11/943,975

(22) Filed: Nov. 21, 2007

(65) Prior Publication Data

US 2008/0143365 A1    Jun. 19, 2008

(30) Foreign Application Priority Data

Dec. 8, 2006    (DE) .................. 10 2006 058 262

(51) Int. Cl.
G01R 31/02    (2006.01)
(52) U.S. Cl. .................................... 324/760
(58) Field of Classification Search ............... 324/760, 324/156–157; 361/600
See application file for complete search history.

(56) References Cited

U.S. PATENT DOCUMENTS

| 5,835,997 A * | 11/1998 | Yassine ..................... 324/754 |
| 6,124,725 A * | 9/2000 | Sato ........................... 324/765 |
| 2006/0205322 A1* | 9/2006 | Kalenian et al. ............... 451/5 |

* cited by examiner

Primary Examiner—Ha Tran T Nguyen
Assistant Examiner—Shaun Campbell
(74) Attorney, Agent, or Firm—Heslin Rothenberg Farley & Mesiti P.C.; Victor A. Cardona, Esq.

(57) ABSTRACT

A prober is described that is suitable for testing of semiconductor substrates under atmospheric conditions that deviate from ambient conditions. The prober includes a chuck for mounting of a semiconductor substrate and a probe holder for mounting of test tips for electrical contacting of the semiconductor substrate. The semiconductor substrate and test tips are arranged within a housing sealed relative to the surrounding atmosphere. The housing comprises two housing parts joined with a seal. The seal can be inflated with two different pressures and is less deformable at higher pressure. For testing of the semiconductor substrate, coarse positioning of the semiconductor substrate relative to the test tips occurs under atmospheric conditions and then fine positioning with the sealed housing and deformable seal before the lower deformability of the seal is produced at higher pressure in the seal and the semiconductor substrate is contacted by the test tips and tested.

21 Claims, 4 Drawing Sheets

PROBE STATION AND METHOD FOR MEASUREMENTS OF SEMICONDUCTOR DEVICES UNDER DEFINED ATMOSPHERE

CROSS REFERENCE TO RELATED APPLICATIONS

This application claims priority of German patent application No. 10 2006 058 262.4, filed Dec. 8, 2006, which application is hereby incorporated herein by reference in its entirety.

BACKGROUND OF THE INVENTION

The invention concerns a test device for testing semiconductor substrates, known as a prober. Testing often occurs under special environmental conditions with respect to temperature and atmosphere, for example, under elevated temperature in a nitrogen atmosphere. The nitrogen atmosphere then serves to avoid corrosion of the elements of the test substrate. The test arrangement for such special test conditions is surrounded by a housing, which accomplishes the required temperature shielding or the required pressure-tight closure or both relative to the surrounding atmosphere.

Such test devices regularly have a chuck within the housing, i.e., a holding device for the test substrate, which is adjusted with respect to the surface and mechanical and electrical, and optionally also chemical properties, to the semiconductor substrate being tested and the test conditions. Both wafers with individual components formed on them and individual components in different manufacturing stages are considered as semiconductor substrate.

The semiconductor substrate arranged on the chuck has contact surfaces, which are contacted with correspondingly adjusted test tips mechanically and electrically for the test, in order to act upon the semiconductor substrate with a signal or tap an output signal. Depending on the type of test, contacting can also last a few minutes to hours, in order to test, for example, the reliability of the substrate under continuous operation under comparable or intensified conditions. For such longer-lasting tests, the geometric accuracy of contacting is especially significant.

Positioning of the test tips relative to the contact surfaces of the semiconductor substrate occurs by means of appropriate positioning devices, with which the relative position of both contact partners can be produced by either moving the chuck alone or the chuck and the test tips in the three spatial directions X, Y and Z.

SUMMARY OF THE INVENTION

The described prober permits adjustment of a test atmosphere deviating from the surroundings with reduced time and energy demands, in comparison with known probers, and, at the same time, improvement of operation and maintenance of different components, for example, operation and maintenance of the positioning device during the test.

The described prober also permits production and maintenance of the test atmosphere within the housing flexibly and quickly, in which no demanding and rigid mounting of the housing parts being connected is required. Since no screw connections to the housing parts are necessary for their pressure-tight and gas-tight connections, the configuration of the housing itself can be more flexible. Individual components of the prober can be modified as housing part, since no flanges are required for pressure-tight screw connection. The housing volume can thus be reduced to a dimension, so that only the components of the prober that must remain in the defined test atmosphere are enclosed. For example, it is possible to arrange at least one positioning unit or at least its manipulators outside of the housing.

The flexibility of housing shape and housing size is also supported by the fact that sealing can be adaptable to the shape of the housing parts and the topography of the sealing surfaces by its preparation, for example, from elastic material. By inflation, it is pressed against the sealing surfaces of both housing parts and therefore connects both flat sealing surfaces and those with slopes, elevations or recesses or the like in sealed fashion, in which such deviations from a plane can be compensated by the seal itself. If one of the two housing parts has a flat sealing surface, whose outer periphery is larger than the second sealing surface having the seal, sealing of both housing parts relative to each other is also possible during their offset when the offset lies within the enlarged flat sealing surface.

Because of the deformability of the seal between both housing parts, at least in the first pressure stage, the demands for alignment of both housing parts and therefore the components of the measurement equipment connected to them can also be reduced. After production of pressure tightness by means of the first pressure stage, the seal remains deformable within limits that are definable by the shape of the seal and its first pressure stage. The deformability of the seal permits movement of the two housing parts within these limits.

Because of the deformability of the seal and its configuration possibilities, the different known positioning concepts can also be used with the described prober. This means both positioning alone can be used by the positioning device of the chuck and a combination of positioning of the chuck with positioning of the test tips by means of an additional positioning unit. The different combinations of coarse and fine positioning can also be executed. For example, according to the available positioning devices, fine positioning can be carried out after production of pressure tightness with the first pressure stage in the seal, whereas coarse positioning with larger travel paths to be covered, and which must satisfy higher requirements on accessibility, can still be carried out under atmospheric conditions.

The seal that is exposed to different pressures is adaptable to the pressure difference to be produced between the surroundings and the measurement atmosphere within the housing, in which the pressure within the seal can be greater at higher pressure differences and lower at small pressure differences. The first of the two pressures is then adjusted, so that the seal is already active and deformability is still guaranteed in the context of any required movements of the two housing parts relative to each other.

The described prober can be used for a wide variety of tests, i.e., both at overpressure and underpressure, and also at high and low temperatures, since the material and configuration of the seal can be adapted to the corresponding requirements. For this purpose, vacuum sources or gas feeds or both are connected in the usual manner to the housing, or cooling or heat sources are used in the housing. For example, temperature control of the semiconductor substrate is also possible via a coolable or heatable chuck. It is then possible to optimize the housing in shape, size and with the required connections, so that the test parameters are adjustable and the housing volume can be minimized with the required internals.

BRIEF DESCRIPTION OF THE DRAWINGS

The prober and the method for testing of semiconductor substrates with the prober will be further explained by means of practical examples. For representation, the drawings show in FIG. 1 a prober according to the invention with a chuck and a housing part in the mounting position.

DESCRIPTION OF EMBODIMENTS

Figure 1:
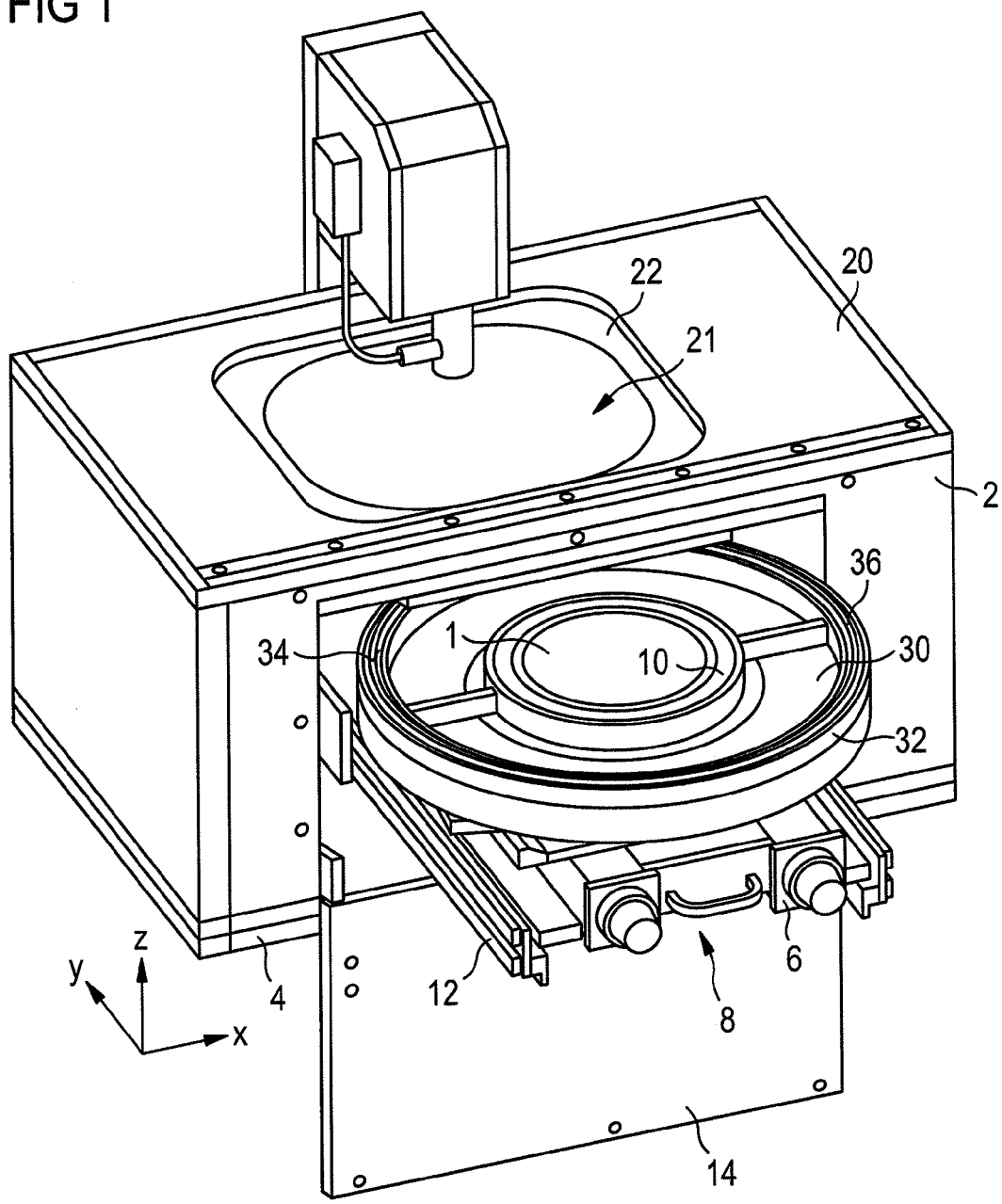

The prober according to FIG. 1 includes an outer electrically conducting enclosure 2, which serves as electromagnetic shield. An X-Y-crosstable 6 is mounted on the base plate 4 of the outer enclosure 2, which carries chuck 8 and accomplishes positioning of chuck 8 in the X- and Y-direction. Chuck 8 and crosstable 6 are movable by means of a slide 12 between a working position within the outer enclosure 2 and a mounting position outside of the outer enclosure 2. If the chuck 8 is situated within the outer enclosure 2 in its working position, the opening in the outer enclosure 2, through which the chuck is moved to its two positions, can be closed by a flap 14. Since the outer enclosure 2 serves as electromagnetic shield and not to maintain a defined pressure, it is not necessary to make the flap 14 pressure-tight.

The chuck 8 has a Z-positioning device (not further shown), with which the mounting plate 10 of chuck 8 can be moved in the Z-direction. The semiconductor substrate 1 being tested, in the depicted practical example a wafer, is arranged on mounting plate 10. Instead of the wafer, individual semiconductor substrates 1 of different configuration and function can be also be arranged on mounting plate 10.

In one practical example, the chuck 8 is designed as a thermochuck and serves for temperature control of the semiconductor substrate 1 arranged on the mounting plate 10 to temperatures of up to a few hundred degrees Celsius, in addition to holding. For this purpose, it has a heating device in the mounting plate 10. In another embodiment, the mounting plate 10 can be traversed by a coolant, so that the semiconductor substrate 10 is coolable and measurable at low temperatures.

The outer enclosure 2 is covered with a probe holder plate 20 (FIG. 1), which simultaneously serves as the holder of test tips (probes—not shown). The probe holder plate 20 has a central opening 21, through which the semiconductor substrate 1 and the test tips can be observed, when the chuck is in the working position. The central opening 21, during a measurement that is to occur during an over- or underpressure must be closed pressure-tight by means of a cover plate (not shown). The cover plate can be equipped for observation purposes with a central view window.

On the bottom of the sample holder plate 20, and therefore within the outer enclosure 2, a probe card adapter 22 is mounted, which partially closes the central opening 21 of the sample holder plate 20, and also has a central opening 21. The central openings 21 of the probe holder plate 20 and the probe card adapter 22 are arranged concentrically. The probe card adapter 22 serves to hold a probe card (not shown).

A base plate 30, extending essentially parallel and concentric to the mounting plate 10, is connected to chuck 8 and mounted beneath mounting plate 10, whose diameter is greater than that of the mounting plate 10. The base plate 30 is peripherally enclosed by a cylindrical housing wall 32 that ends a few millimeters above the mounting plate 10.

In the upper closure of surface 34 of the housing wall 32, a hollow sealing ring 36 made of elastic material is integrated, whose annular cavity is connected to a pressure generation device (not shown). By means of the pressure generation device, at least two different pressure stages can be adjusted within the sealing ring 36, both pressure stages generally being freely selectable, since the pressure can generally be available in stepless fashion by means of a pressure generation device.

Figure 2A:
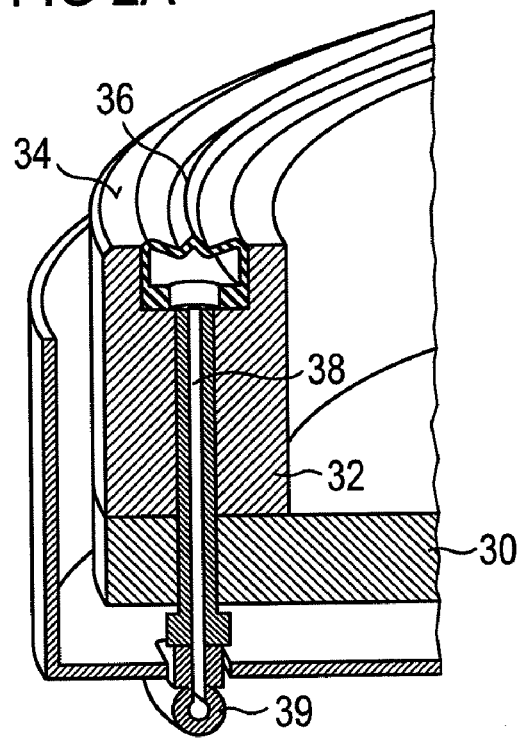
FIGS. 2A and 2B the housing wall with inflatable seal, expanded and inflated with housing cover.
Figure 2B:
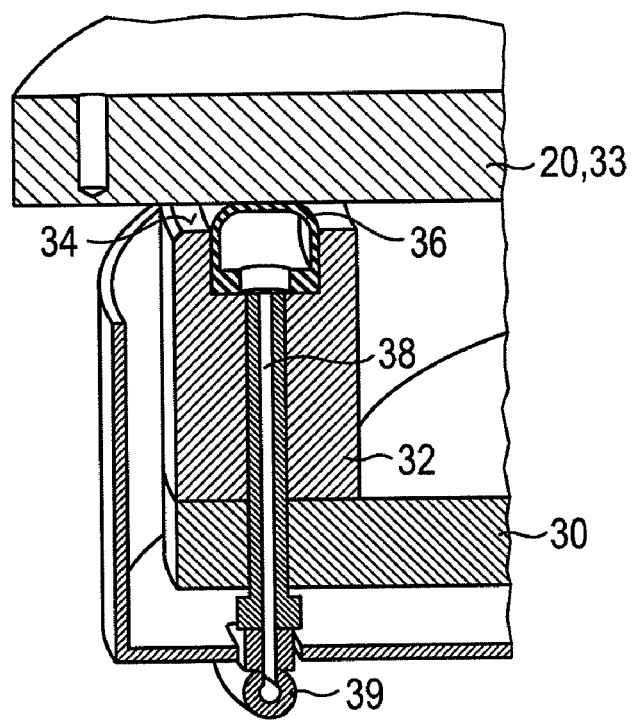

In FIGS. 2A and 2B, the housing wall 32 is shown in detail with the sealing ring 36. For pressure generation within sealing ring 36, several peripherally distributed gas feed channels 38 lead into sealing ring 36 from an annular distribution line 39 that runs beneath base plate 30 in the depicted variant. The gas feed channels 38 are formed in housing wall 32, but, as an alternative, like the distribution line 39, can be configured differently, in order to adjust the pressure stages uniformly to the required level in a short time in sealing ring 36.

If a pressure comparable to atmospheric pressure is set in sealing ring 36, the sealing ring 36 is expanded and extends only slightly beyond the upper closure surface 34 (FIG. 2A). If the sealing ring 36 is inflated with a defined pressure, it bulges beyond the upper closure surface 34 and accomplishes sealing relative to housing cover 33 (FIG. 2B), here the probe holder plate 22. As an alternative, other components can also form the housing cover 33, if they have the required shape and surface, in order to guarantee the required pressure tightness during the entire measurement cycle jointly with the inflated sealing ring 36, and if they have the mechanical stability required for this.

The bulging of the sealing ring 36 is made possible by a W-shaped profile of the wall section of the sealing ring 36 in the expanded state, which lies opposite housing cover 33. The multiple slopes of this profile at a sufficiently elevated pressure are pushed outward relative to the ambient pressure and thus increase the height of the sealing ring. The distance, at which the housing wall 32, according to the following description, and the housing cover 33 must be situated relative to each other to produce pressure tightness, is adjusted to this height difference, possible through the profile and, to a lesser degree, through the flexibility of the material of the sealing ring 36.

Figure 3:
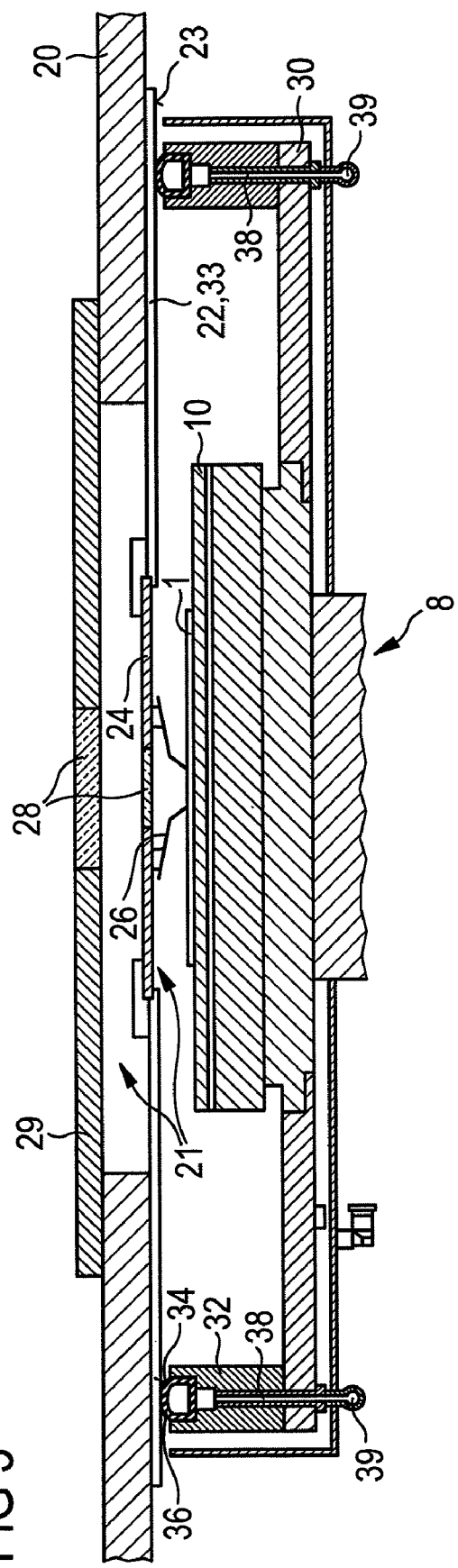
FIG. 3 the housing of a prober in a sectional view, with a chuck, the probe holder and with test tips in contact with semiconductor substrates.

In the depicted practical example according to FIG. 3, the probe card adapter 22 forms the upper housing cover 33, in which the chuck 8 is moved into the working position within the outer enclosure 2 in the Z-direction against the probe card adapter 22, until the required pressure is produced, in order to produce the required tightness at the defined pressure in the sealing ring 36 and at the defined pressure difference between the housing volume and the surrounding atmosphere. The diameter of the probe card adapter 22 in this practical example is consequently greater than the diameter of the sealing ring 36, and the bottom 23 of the probe card adapter 22 is also planar, so that it forms the sealing surface against which the sealing ring 36 is pressed.

The base plate 30, together with the housing wall 32, therefore forms the lower part of the housing according to the invention and the probe card adapter 22, together with the probe card 24, its upper part. The lower part, because of its mounting on chuck 8, which is naturally designed tight for the pressure differences and gases to be used, is movable in the X-, Y- and Z-direction by means of the positioning devices of the chuck.

The probe card adapter according to FIG. 3 also has a central opening 21. This is closed by a probe card 24, so that the required tightness is also guaranteed at this connection. The probe card 24 is an electrically insulating card carrying the test tips 26 and produces the electrical connection to the test tips 26 by means of conductor tracks (not further shown). The test tips are arranged on the bottom of probe card 24 and therefore lying opposite the semiconductor substrate situated on the mounting plate 10 of chuck 8. The test tips 26 are arranged on probe card 24 in an arrangement corresponding to the contact surfaces of the semiconductor substrate 1. Above the area in which the test tips will contact the semiconductor substrate 1 a view window 28 is formed in probe card 24, in order to be able to observe the contacting process.

Since the seal of the housing, as described above, is produced in the variant according to FIG. 3 between the housing wall 32 and bottom 23 of the probe card adapter 22, the probe card adapter 22 is arranged beneath the probe holder plate 20, so that its central opening 21 is fully closed. It is self-evident that when the housing cover 33 is formed by the probe holder 20 or by another, also separate component, an arrangement of the probe card adapter 22 deviating from the type just described can occur, or the probe card adapter 22 can drop out entirely, if the configuration of probe card 24 permits. The central opening 21 of the probe holder plate 20 is closed by a cover plate 29 for protection of the probe card 24, which also has a view window 28 above the view window 28 of probe card 24.

The arrangement of the gas feed channels 38 and the annular distribution line 39 is shown in FIG. 3. Their structure and function correspond to those in FIGS. 2A and 2B, in which the same reference numbers were used for the same components, so that the above description can be referred to.

Figure 4:
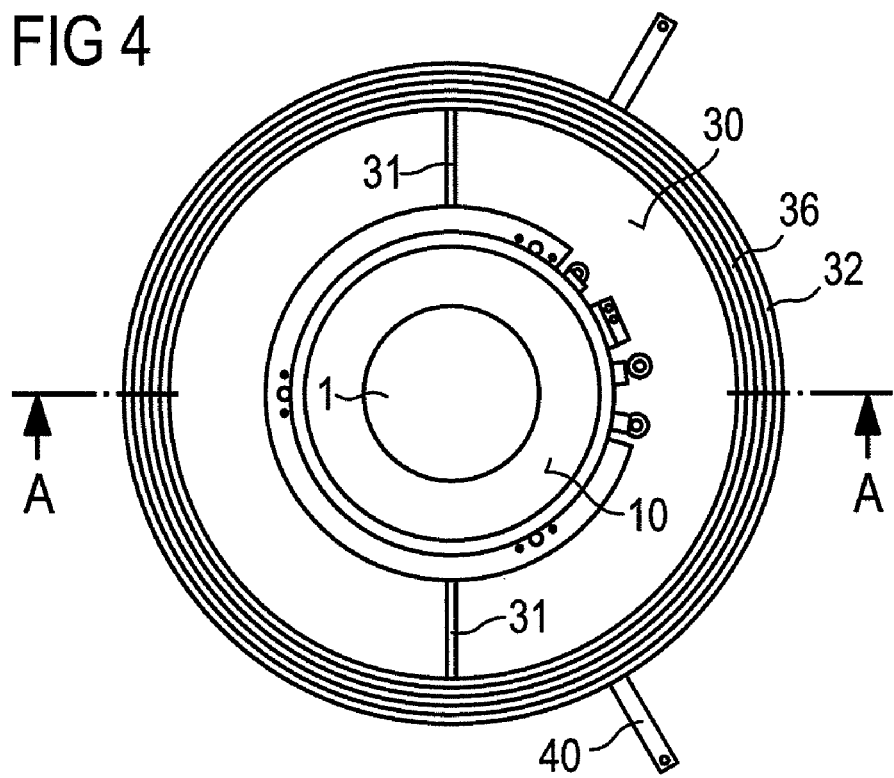
FIG. 4 the chuck with the lower housing part according to FIG. 3 in a top view and FIG. 5 the chuck with the lower housing part according to FIG. 3 in a perspective view.
Figure 5:
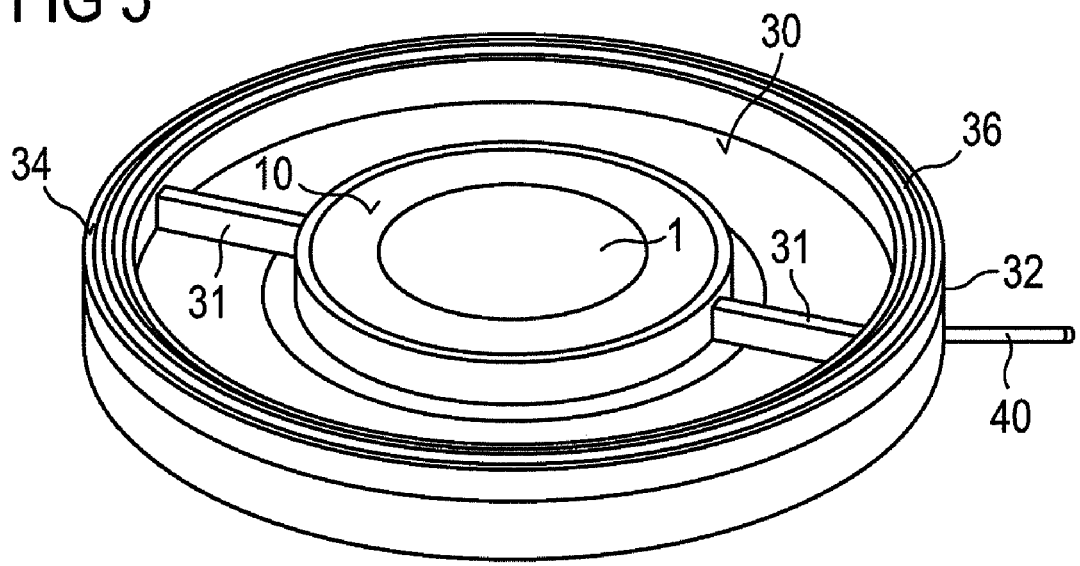

FIGS. 4 and 5 represent the lower housing part of the housing from FIG. 3 in a top view and a perspective view for better understanding. The lower housing part includes the base plate 30, the housing wall 32 with sealing ring 36, as well as the mounting plate 10 with the semiconductor substrate 1. To describe the essential structure, the above explanations to FIG. 3 are referred to. As a supplement, the gas feed line 40 to the annular distribution line 39, as well as two radial separation walls 31, extending between the mounting plate 10 and housing wall 32 to reinforce the housing, are shown in FIGS. 4 and 5.

To perform a test in the prober just described, the semiconductor substrate 1 is arranged in the mounting position on mounting plate 10 of chuck 8, shown in FIG. 1, the chuck 8 is moved in the interior of the outer enclosure 2 into its working position and therefore beneath probe card adapter 22. Chuck 8 and the housing are then coarsely positioned in the X-, Y- and Z-direction relative to the test tips. Coarse positioning occurs in the practical example to within a few 100 µm, but, depending on the semiconductor substrate 1, the test task and the positioning devices can also occur with a deviating accuracy. As a result of coarse positioning, the housing wall 32 and the sealing ring 36 are therefore situated with a spacing beneath the bottom 23 of probe card adapter 22, so that during the above-described bulging of the sealing ring 36, it is pressed against the bottom 23 of probe card adapter 22 with the force and surface required for the pressure difference to be established. In this position, the contact surfaces of the semiconductor substrate 1 are situated beneath the test tips 26, without contact being produced between test tips 26 and the contact surfaces.

The sealing ring 36 is then inflated with a first pressure that is large enough, that sealing is produced relative to the bottom 23 of the probe card adapter 22, but the sealing ring 36 is still deformable, so that it permits a movement of chuck 8 and therefore housing wall 32 relative to probe card adapter 22 of a few hundred µm, without threatening tightness.

The interior of the housing that is pressure-tight relative to the surrounding atmosphere is then scavenged with nitrogen, until the oxygen content has dropped below a predefined percentage. Subsequent heating of the mounting plate 10 of chuck 8 and therefore semiconductor substrate 1 occurs under a nitrogen atmosphere and without contact of the semiconductor substrate 1 by the test tips 26. Damage to the test tips 26 or the semiconductor substrate 1 as a result of thermal expansion is therefore prevented during heating.

Subsequent fine positioning and contacting of the test tips 26 and semiconductor substrate 1 occurs at or at least almost at the test temperature, while maintaining tightness of the housing with the first pressure in sealing ring 36. If contacting is accomplished and the required test conditions are therefore produced, the pressure in the sealing ring 36 is increased to the second, final pressure, so that the required long-term sealing is guaranteed even under a low pressure within the housing. Testing of the semiconductor substrate 1 then occurs. The nitrogen atmosphere produced in the described practical example permits corrosion of the copper-conducting tracks on the semiconductor substrate 1 to be avoided during the test. Naturally, after production of final sealing by means of sealing ring 36, other atmospheric conditions can also be produced.

The invention claimed is:

1. A prober for testing of semiconductor substrates comprising:
    a chuck, which has a mounting plate for mounting of a semiconductor substrate,
    a probe holder to accommodate test tips which serve for electrical contacting of the semiconductor substrate for testing, and
    a positioning device with which the mounting plate can be moved relative to the test tips in X-, Y- and Z-directions,
    the semiconductor substrate and the test tips being arranged within a housing that is sealed relative to a surrounding atmosphere, the housing comprises two housing parts joined with a seal, and the seal is connected to a pressure generation device for inflation with a plurality of different pressures;
    the seal comprising a first upwardly extending portion and a second portion of the seal adjacent said first portion, said first portion extending further toward at least one housing part of said housing parts than said second portion extends toward said at least one housing part at a first pressure of the plurality of different pressures;
    said first portion and said second portion contacting said at least one housing part at a second pressure of the plurality of different pressures, said second pressure allowing movement of said two housing parts relative to each other; and
    said first portion and said second portion contacting said at least one housing part at a third pressure of the plurality of different pressures, said first portion and said second portion being less deformable and allowing less movement of said two housing parts relative to each other at said third pressure relative to said second pressure, said second pressure being less than said third pressure.

2. Prober according to claim 1, wherein the chuck is movable, at least in the X- and Y-directions, and a lower housing part encloses the mounting plate and the semiconductor substrate and is connected to the chuck, so that the lower housing part is moved with the chuck.

3. Prober according to claim 1, wherein said first housing part includes the seal and second housing part has a flat sealing surface against which the seal is pressed in different positions of the sealing surface and seal relative to each other.

4. Prober according to claim 1, wherein the mounting plate is temperature-controllable.

5. Prober according to claim 1, wherein the housing is adapted to be connected to a vacuum source and has a gas feed for inlet of a gas.

6. Prober according to claim 1, wherein the mounting plate and/or the test tips are adapted to be coarsely and finely positioned relative to each other.

7. Prober according to claim 1, wherein the positioning device includes a first positioning device for positioning of the chuck and a second positioning device for positioning of the test tips.

8. Prober according to claim 1, wherein the positioning device is adapted to be manipulated from outside of the housing.

9. Housing of a prober for testing of semiconductor substrates, which encloses a work area, in which testing occurs, and is sealed off relative to the surrounding atmosphere, comprising two housing parts, which are joined via a seal, and the seal is adapted to be inflated with a plurality of different pressures;

the seal comprising a first upwardly extending portion and a second portion of the seal adjacent said first portion, said first portion extending further toward at least one housing part of said housing parts than said second portion extends toward said at least one housing part at a first pressure of the plurality of different pressures;

said first portion and said second portion contacting said at least one housing part at a second pressure of the plurality of different pressures, said second pressure allowing movement of said two housing parts relative to each other; and said first portion and said second portion contacting said at least one housing part at a third pressure of the plurality of different pressures, said first portion being less deformable and allowing less movement of said two housing parts relative to each other at said third pressure relative to said second pressure, said second pressure being less than said third pressure.

10. Method for testing of semiconductor substrates within a housing sealed relative to the surrounding atmosphere according to claim 9, further comprising first coarsely and later finely positioning a semiconductor substrate arranged on a mounting surface of a chuck relative to test tips by a positioning device, after the fine positioning, electrically contacting the substrate by the test tips, wherein the coarse positioning occurs under atmospheric conditions at said first pressure, whereupon the housing is sealed at said second pressure relative to surrounding atmosphere by inflation of the seal and a defined atmosphere is produced within the housing, after which the fine positioning occurs, and the seal of the housing is inflated to said third pressure, so that sealing required for the test is produced and the semiconductor substrate is then contacted with the test tips and tested.

11. Method according to claim 10, wherein in the semiconductor substrate, after production of the defined atmosphere and before fine positioning, is temperature-controlled.

12. Method according to claim 10, wherein after inflation to the third pressure in the seal, a test atmosphere deviating from the defined atmosphere is produced in the housing.

13. The prober of claim 1 wherein said first portion extends further toward said at least one housing part than said second portion extends toward said at least one housing part at said first pressure.

14. The prober of claim 1 wherein said first portion and said second portion comprise two portions of a plurality of portions forming a W shape at said first pressure.

15. The prober of claim 1 wherein said second portion comprises a trough adjacent said first portion at said first pressure.

16. A prober for testing of semiconductor substrates comprising:

a chuck, which has a mounting plate for mounting of a semiconductor substrate, a probe holder to accommodate test tips which serve for electrical contacting of the semiconductor substrate for testing, and a positioning device with which the mounting plate can be moved relative to the test tips in X-, Y- and Z-directions, the semiconductor substrate and the test tips being arranged within a housing that is sealed relative to a surrounding atmosphere, the housing comprises two housing parts joined with a seal, and the seal is connected to a pressure generation device for inflation with a plurality of different pressures;

the seal comprising a first upwardly extending contacting portion and a second portion of the seal adjacent said first portion, said first portion extends further toward at least one housing part of said housing parts than said second portion extends toward said at least one housing part at a first pressure of the plurality of different pressures;

the first portion and the second portion contacting said at least one housing part at a second pressure of the plurality of different pressures.

17. The prober of claim 16 wherein the first portion and the second portion contact said at least one housing part at a third pressure of the plurality of pressures such that the first portion is less deformable at said third pressure relative to said second pressure, said second pressure being less than said third pressure.

18. The prober of claim 16 wherein said first portion and said second portion allow movement of said two housing parts relative to each other at said second pressure.

19. The prober of claim 18 wherein said first portion and said second portion allow less movement of said two housing parts relative to each other at said third pressure relative to said second pressure.

20. The prober of claim 16 wherein said first portion and said second portion comprise two portions of a plurality of portions forming a W shape at said first pressure.

21. The prober of claim 16 wherein said second portion comprises a trough adjacent said first portion at said first pressure.

* * * * *